(12) United States Patent
Kim et al.

(10) Patent No.: US 9,761,652 B2
(45) Date of Patent: Sep. 12, 2017

(54) DISPLAY APPARATUS HAVING REDUCED SIGNAL DISTORTION

(71) Applicant: SAMSUNG DISPLAY CO., LTD., Yongin-si, Gyeonggi-Do (KR)

(72) Inventors: Taehoon Kim, Yongin-si (KR); Jisu Na, Yongin-si (KR); Seungkyu Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/099,189

(22) Filed: Apr. 14, 2016

(65) Prior Publication Data

US 2016/0372533 A1    Dec. 22, 2016

(30) Foreign Application Priority Data

Jun. 22, 2015    (KR) .................. 10-2015-0088709

(51) Int. Cl.
*H01L 33/00* (2010.01)
*H01L 27/32* (2006.01)

(52) U.S. Cl.
CPC ...... *H01L 27/3272* (2013.01); *H01L 27/3265* (2013.01); *H01L 27/3276* (2013.01)

(58) Field of Classification Search
None
See application file for complete search history.

(56) References Cited

U.S. PATENT DOCUMENTS

| | | |
|---|---|---|
| 2003/0184703 A1 | 10/2003 | Greene et al. |
| 2005/0068310 A1 | 3/2005 | Ishii |
| 2008/0084365 A1* | 4/2008 | Takahara .............. G09G 3/006 345/76 |
| 2010/0134743 A1* | 6/2010 | Shin ..................... G02F 1/13 349/143 |
| 2011/0102693 A1 | 5/2011 | Oomura |
| 2012/0112987 A1* | 5/2012 | Tan .................... G02F 1/13624 345/32 |
| 2013/0093658 A1* | 4/2013 | Park .................. G02F 1/13452 345/92 |
| 2014/0167009 A1* | 6/2014 | Lee .................... H01L 27/3272 257/40 |

(Continued)

FOREIGN PATENT DOCUMENTS

| | | |
|---|---|---|
| JP | 2009-069768 | 4/2009 |
| KR | 10-2005-0021887 | 3/2005 |

(Continued)

*Primary Examiner* — Sitaramarao S Yechuri
(74) *Attorney, Agent, or Firm* — F. Chau & Associates, LLC

(57) ABSTRACT

A display apparatus includes a data line extending in a first direction, a main scan line disposed substantially parallel to the data line, a sub scan line extending in a second direction that crosses the main scan line, wherein the sub scan line is electrically connected with the main scan line, a driving voltage line extending in the first direction and disposed between the data line and the main scan line, and a shield layer disposed on a layer that is different from a layer on which the driving voltage line is disposed, the shield layer being electrically connected with the driving voltage line, wherein the shield layer overlaps at least one of the data line and the main scan line.

17 Claims, 13 Drawing Sheets

(56) References Cited

U.S. PATENT DOCUMENTS

| | | | |
|---|---|---|---|
| 2015/0097172 A1* | 4/2015 | Han | H01L 27/3262 257/40 |
| 2015/0123135 A1* | 5/2015 | Li | G02F 1/136227 257/72 |
| 2016/0056177 A1* | 2/2016 | Li | H01L 27/124 257/72 |
| 2016/0155752 A1* | 6/2016 | Huang | H01L 27/124 257/72 |

FOREIGN PATENT DOCUMENTS

| | | |
|---|---|---|
| KR | 1020060030440 | 4/2006 |
| KR | 1020070019460 | 2/2007 |

* cited by examiner

DISPLAY APPARATUS HAVING REDUCED SIGNAL DISTORTION

CROSS-REFERENCE TO RELATED APPLICATION

This application claims priority under 35 U.S.C. §119 to Korean Patent Application No. 10-2015-0088709, filed on Jun. 22, 2015, in the Korean Intellectual Property Office, the disclosure of which is incorporated by reference herein in its entirety.

TECHNICAL FIELD

Exemplary embodiments of the inventive concept relate to a display apparatus, and more particularly, to a display apparatus having a reduced data signal distortion.

DISCUSSION OF THE RELATED ART

In an organic light-emitting display apparatus, thin film transistors (TFTs) are generally disposed in each sub-pixel to adjust a brightness of each sub-pixel. The TFTs adjust the brightness of each sub-pixel according to received data signals.

However, in a display apparatus, data signals may be distorted while being transmitted to a sub-pixel, and thus, the actual brightness of a sub-pixel may be different from an intended brightness. In this case, an image may be displayed on the display apparatus differently than intended. Accordingly, the display image may be a low-quality image.

SUMMARY

According to an exemplary embodiment of the inventive concept, a display apparatus includes a data line extending in a first direction. A main scan line is disposed substantially parallel to the data line. A sub scan line extends in a second direction that crosses the main scan line, wherein the sub scan line is electrically connected with the main scan line. A driving voltage line extends in the first direction and is disposed between the data line and the main scan line. A shield layer is disposed on a layer that is different from a layer on which the driving voltage line is disposed, the shield layer being electrically connected with the driving voltage line. The shield layer overlaps at least one of the data line and the main scan line.

In an exemplary embodiment of the inventive concept, the data line, the main scan line, and the driving voltage line are disposed on a same layer.

In an exemplary embodiment of the inventive concept, the shield layer is disposed on a layer on which the sub scan line is disposed.

In an exemplary embodiment of the inventive concept, the sub scan line is disposed under the data line, the main scan line, and the driving voltage line.

In an exemplary embodiment of the inventive concept, the display apparatus further includes a storage capacitor including a first storage capacitor plate and a second storage capacitor plate, the second storage capacitor plate overlapping the first storage capacitor plate and being disposed above the first storage capacitor plate. The shield layer is a portion of the second storage capacitor plate.

In an exemplary embodiment of the inventive concept, the second storage capacitor plate is disposed under the data line, the main scan line, and the driving voltage line.

In an exemplary embodiment of the inventive concept, the shield layer overlaps each of the data line and the main scan line.

In an exemplary embodiment of the inventive concept, two sub-pixels are disposed adjacent to each other symmetrically opposed between an axis parallel to the first direction.

In an exemplary embodiment of the inventive concept the shield layer is integrally formed in the two adjacent sub-pixels.

In an exemplary embodiment of the inventive concept, the display apparatus includes a display area that does not include an angular portion in an outer periphery of the display area. The data line, the main scan line, the sub scan line, and the driving voltage line are disposed in the display area.

In an exemplary embodiment of the inventive concept, the display apparatus includes a circular, oval, or elliptical-shaped display area. The data line, the main scan line, the sub scan line, and the driving voltage line are disposed in the display area.

According to an exemplary embodiment of the inventive concept, a display apparatus includes a sub scan line disposed on a first layer, the sub scan line extending in a second direction. A shield layer is disposed on a second layer. A main scan line is disposed on a third layer, the main scan line extending in a first direction that crosses the second direction. The sub scan line and the main scan line are electrically connected. The second layer is disposed between the first and third layers. A data line is disposed on the third layer and extends in the first direction. A driving voltage line is disposed on the third layer and extends in the first direction. The shield layer and the driving voltage line are electrically connected. The shield layer overlaps at least one of the data line and the main scan line.

In an exemplary embodiment of the inventive concept, the shield layer overlaps the data line and the main scan line.

In an exemplary embodiment of the inventive concept, the display apparatus further includes a capacitor, wherein the capacitor includes a first capacitor plate disposed on the first layer and a second capacitor plate disposed on the second layer, wherein the second capacitor plate is electrically connected to the shield layer.

In an exemplary embodiment of the inventive concept, the second capacitor plate and the driving voltage line are electrically connected through a contact hole formed in the third layer.

In an exemplary embodiment of the inventive concept, the shield layer is a part of the second capacitor plate.

In an exemplary embodiment of the inventive concept, the shield layer has an L-shape.

In an exemplary embodiment of the inventive concept, the data line is disposed between the main scan line and the driving voltage line.

According to an exemplary embodiment of the inventive concept, a display apparatus includes a sub scan line disposed on a first layer, the sub scan line extending in a second direction. A shield layer is disposed on the first layer. A capacitor includes a first capacitor plate disposed on the first layer and a second capacitor plate disposed on a second layer. A main scan line is disposed on a third layer, the main scan line extending in a first direction that crosses the second direction. The sub scan line and the main scan line are electrically connected. The second layer is disposed between the first and third layers. A data line is disposed on the third layer and extends in the first direction. A driving voltage line is disposed on the third layer and extends in the first direction. The shield layer is electrically connected to the driving voltage line. The shield layer overlaps the data line or the main scan line.

In an exemplary embodiment of the inventive concept, the shield layer overlaps the data line and the main scan line.

BRIEF DESCRIPTION OF THE DRAWINGS

The above and other features and aspects of the inventive concept will become more apparent and more readily appreciated by describing in detail exemplary embodiments of the inventive concept with reference to the accompanying drawings, in which.

DETAILED DESCRIPTION OF THE EMBODIMENTS

Figure 1:
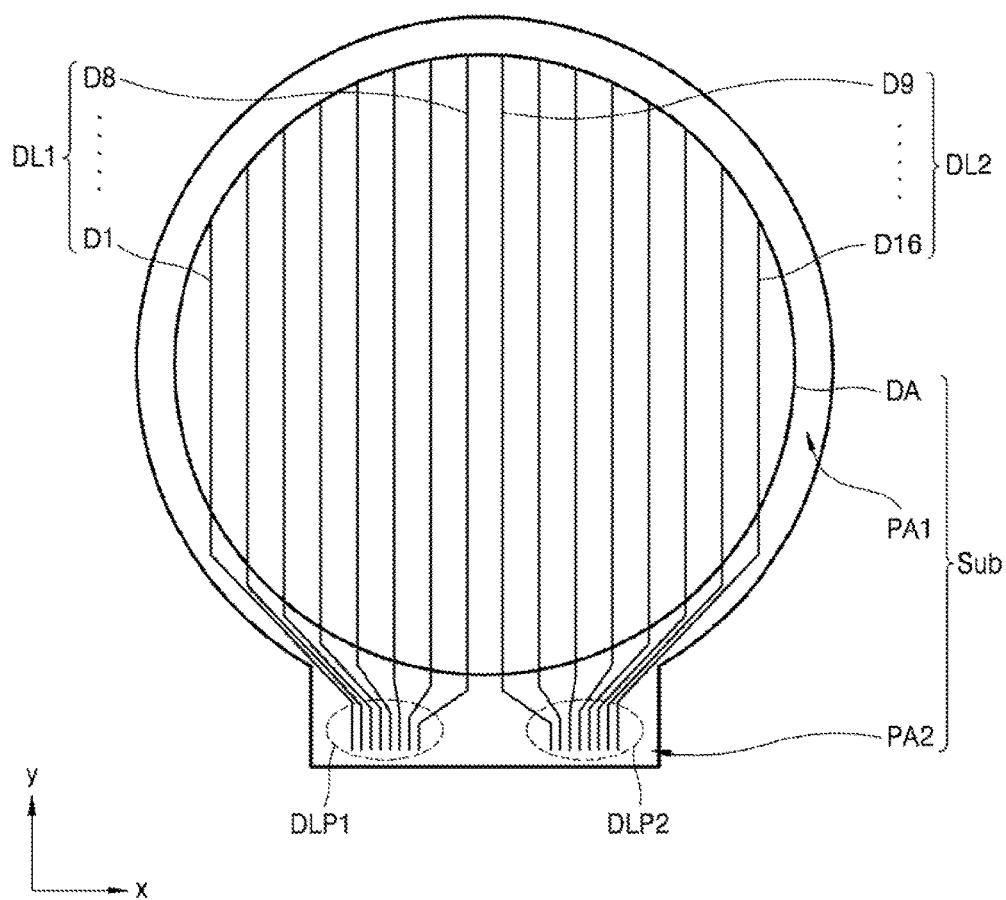
FIG. 1 is a view illustrating a portion of a display apparatus, according to an exemplary embodiment of the inventive concept.

Hereinafter, exemplary embodiments of the inventive concept will be described in detail with reference to the accompanying drawings. However, the inventive concept may be embodied in various forms and should not be construed as being limited to the exemplary embodiments set forth herein. As used herein, the term "and/or" may include any and all combinations of one or more of the associated listed items.

Like reference numerals may refer to like elements throughout the specification. Accordingly, a repeated description thereof may be omitted.

It will be understood that when a layer, region, or component is referred to as being "formed on" another layer, region, or component, the layer, region, or component can be directly formed on the other layer, region, or component, or intervening layers, regions, or components may be present. Sizes of components in the drawings may be exaggerated for convenience of explanation. Accordingly, since sizes and thicknesses of components in the drawings may be arbitrarily illustrated for convenience of explanation, the exemplary embodiments of the inventive concept are not limited thereto.

Figure 2:
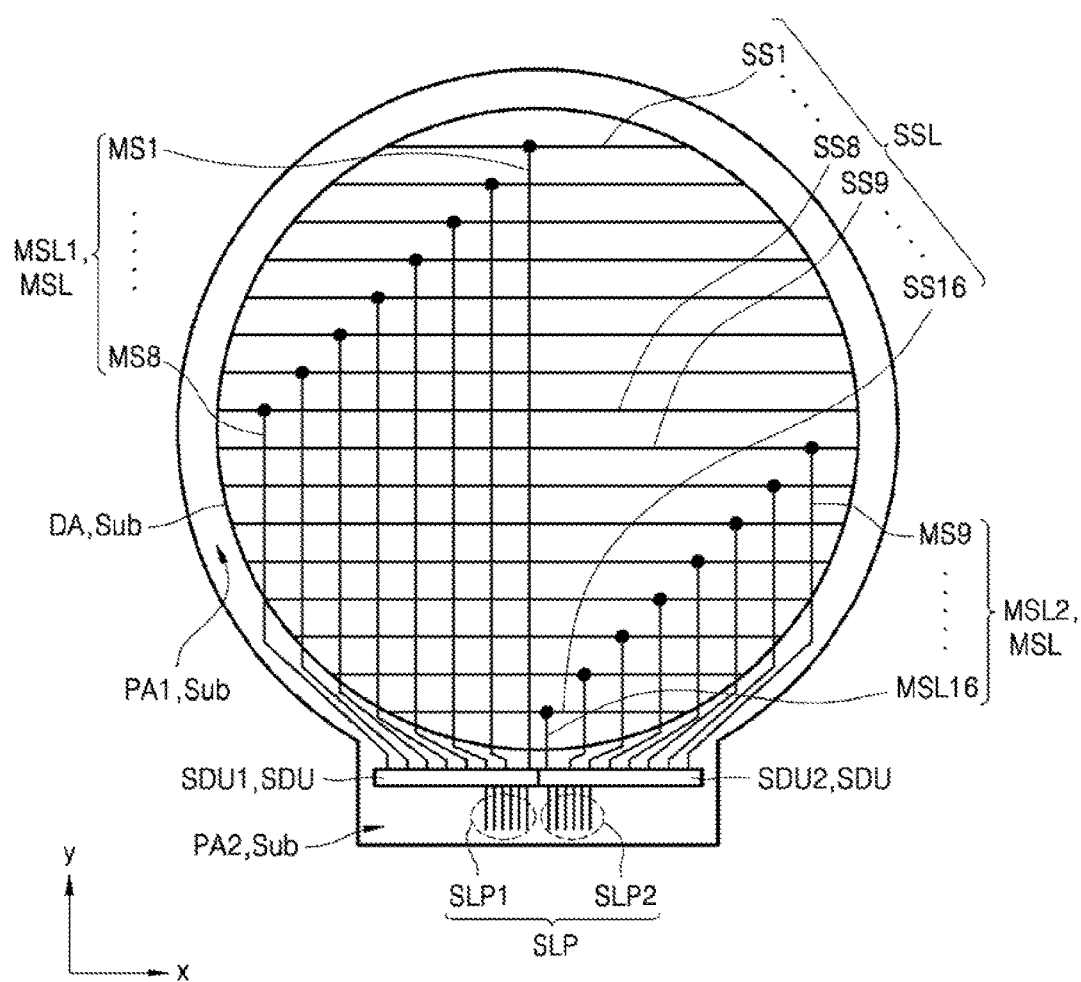
FIG. 2 is a view illustrating a portion of the display apparatus of FIG. 1, according to an exemplary embodiment of the inventive concept.

FIG. 1 is a view illustrating a portion of a display apparatus according to an exemplary embodiment of the inventive concept. FIG. 2 is a view illustrating a portion of the display apparatus of FIG. 1, according to an exemplary embodiment of the inventive concept. The display apparatus, according to an exemplary embodiment of the inventive concept, includes a plurality of first data lines DL1, a plurality of second data lines DL2, a plurality of main scan lines MSL, a plurality of sub scan lines SSL, a plurality of first data line pads DLP1, a plurality of second data line pads DLP2, a plurality of scan line pads SLP, and a plurality of driving voltage lines, which are disposed on a substrate Sub.

The substrate Sub may be formed by using various materials such as glass, metal, or plastic. The substrate Sub includes a display area DA and a first peripheral area PA1 that surrounds the display area DA in a plan view. In FIGS. 1 and 2, the display area DA is circularly shaped and the first peripheral area PA1 is ring shaped and surrounds the display area DA in a plan view. According to an exemplary embodiment of the inventive concept, the display area DA may be circular, elliptical, or the like. According to an exemplary embodiment of the inventive concept, the first peripheral area PA1 is disposed along an outer perimeter of the display are DA. As illustrated in FIGS. 1 and 2, other than the first peripheral area PA1, the substrate Sub may include a second peripheral area PA2 that protrudes from a portion of the first peripheral area PA1. For example, the second peripheral area PA2 may be connected to the first peripheral area PA1. The display area DA may include a first display area and a second display area. For example, as shown in FIGS. 1 and 2, each of the first and second display areas of the display area DA may be half-circle shaped, and respective portions of the first and second display areas which contact each other may cross the center of the display area DA and extend in a y-axis direction. For example, the first display area may correspond to a left portion of the display area DA of FIG. 1, and the second display area may correspond to a right portion of the display area DA of FIG. 1.

The plurality of first data lines DL1 may extend in the y-axis direction, may be disposed in the first display area, and may be parallel to one another across the first display area. For convenience of description, in FIG. 1, eight first data line first data lines D1 to D8 are exemplarily illustrated in the first display area (e.g., disposed in the first area). When the display area DA is a circular shaped area, the first data lines D1 to D8 may have different lengths as shown in FIG. 1. The second data lines DL2 may also extend in the y-axis direction and may be parallel to one another across the second display area. Similarly to the first data lines D1 to D8, in FIG. 1, eight second data lines D9 to D16 are exemplarily illustrated in the second display area. Since the display area DA is circularly shaped, the second data lines D9 to D16 may have different lengths as shown in FIG. 1. The second data lines D9 to D16 are parallel to the first data lines D1 to D8.

Referring to FIG. 2, the main scan lines MSL are parallel to each other across the display area DA, and the main scan lines MSL are parallel to the first data lines DL1 and the second data lines DL2. In FIG. 2, sixteen main scan lines MS1 to MS16 are exemplarily illustrated to extend in the y-axis direction. The main scan lines MS1 to MS16 may have different lengths, or some may have the same length. When disposing the main scan lines MSL across the display area DA, each of the main scan lines MSL may be disposed in at least a portion of the display area DA. It is not necessary for each of the main scan lines MSL to cross the entirety of the display area DA.

The main scan lines MSL may include a plurality of first main scan lines MSL1 and a plurality of second main scan lines MSL2. In this case, similar to the first data lines DL1, the first main scan lines MSL1 may be parallel to one another across the first display area. Similar to the second data lines DL2, the second main scan lines MSL2 may be parallel to one another across the second display area. In FIG. 2, eight main scan lines MS1 to MS8 on the left side are the first main scan lines MSL1, and eight main scan lines MS9 to MS16 on the right side are the second main scan lines MSL2. The eight main scan lines MS1 to MS8 and the eight main scan lines MS9 to MS16 are exemplarily illustrated for convenience of explanation. Exemplary embodiments of the inventive concept may include more than eight or less than eight first main scan lines MSL1 and more than eight or less than eight second main scan lines MSL2.

The main scan lines MSL do not directly contact the first data lines DL1 or the second data lines DL2. In the case that the main scan lines MSL are disposed on the same layer as the first data lines DL1 and the second data lines DL2, they may be alternately disposed such that the main scan lines MSL and the first data lines DL1 do not directly contact one another. Alternatively, when needed, the main scan lines MSL may be disposed on a layer that is different from the layer on which the first data lines DL1 and the second data lines DL2 are disposed on.

The sub scan lines SSL are parallel to one another across the display area DA. The plurality of sub scan lines SSL are disposed such that they intersect (e.g., cross) the main scan lines MSL. In FIG. 2, the sub scan lines SSL extend in an x-axis direction and intersect the main scan lines MSL that extend in the y-axis direction. The sub scan lines SSL may be respectively connected to the main scan lines MSL. In FIG. 2, sixteen sub scan lines SS1 to SS16 of the plurality of sub scan lines SSL are respectively connected to the sixteen main scan lines MS1 to MS16.

The sub scan lines SSL may be disposed on a layer that is different than a layer on which the main scan lines MSL are disposed on. An insulating layer may be provided between the sub scan lines SSL and the main scan lines MSL. Also, the sub scan lines SSL may be electrically connected to the main scan lines MSL via contacts holes formed in the insulating layer. In FIG. 2, the sub scan lines SSL are electrically connected to the main scan lines MSL via contact holes, which are indicated by black dots. For example, the main scan line MS1 is electrically connected to the sub scan line SS1, and the main scan line MS2 is electrically connected to the sub scan line SS2, and likewise, the main scan line MS16 is electrically connected to the sub scan line SS16.

Figure 3:
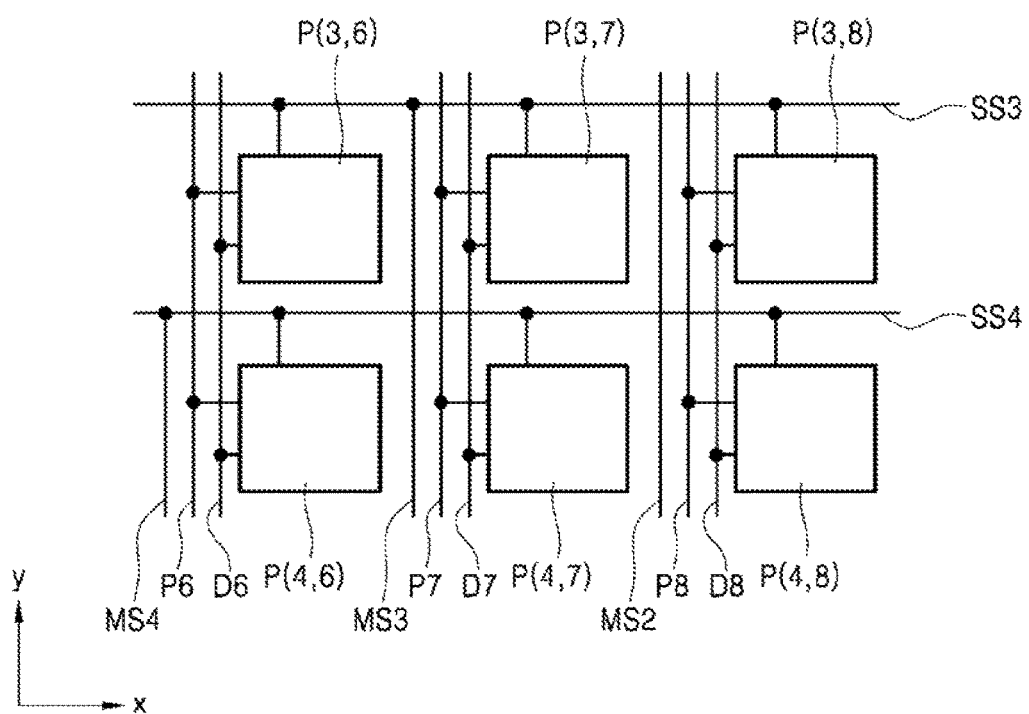
FIG. 3 is a view illustrating a portion of the display apparatus of FIG. 1, according to an exemplary embodiment of the inventive concept.

Intersections between the first and second data lines DL1 and DL2 and the sub scan lines SSL may define sub-pixels. Hereinafter, a sub-pixel and a pixel may be both referred to as a "sub-pixel." FIG. 3 is a view illustrating a portion of the display apparatus of FIG. 1. (e.g., sub-pixel areas). As shown in FIG. 3, a sub-pixel P(3,6) is located at an intersection between the sub scan line SS3 and the data line D6, a sub-pixel P(3,7) is located at an intersection between the sub scan line SS3 and the data line D7, and a sub-pixel P(3,8) is located at an intersection between the sub scan line SS3 and the data line D8. A sub-pixel P(4,6) is located at an intersection between the sub scan line SS4 and the data line D6, a sub-pixel P(4,7) is located at an intersection between the sub scan line SS4 and the data line D7, and a sub-pixel P(4,8) is located at an intersection between the sub scan line SS4 and the data line D8.

Each of the sub-pixels P(3,6), P(3,7), P(3,8), P(4,6), P(4,7), and P(4,8) may include a thin film transistor (TFT) or a capacitor, and a display device. The display device may include, for example, an organic light-emitting device (OLED). Various methods may be used to control the amount of light emitted by the sub-pixels P(3,6), P(3,7), P(3,8), P(4,6), P(4,7), and P(4,8). For example, by applying a scan signal to the main scan line MS3, the scan signal is transmitted to the sub scan line SS3 that is electrically connected to the main scan line MS3, and the sub-pixels P(3,6), P(3,7), and P(3,8) connected to the sub scan line SS3 may be selected. In such state, when a data signal, which is related to a brightness of light to be emitted by the sub-pixels P(3,6), P(3,7), and P(3,8), is applied to the data lines D6 to D8, the brightness of light emitted by the sub-pixels P(3,6), P(3,7), and P(3,8) may be determined according to the applied data signal. By applying a scan signal to the main scan line MS4, the scan signal is transmitted to the sub scan line SS4 that is electrically connected to the main scan line MS4, and the sub-pixels P(4,6), P(4,7), and P(4,8) may be selected. In such state, when a data signal, which is related to a brightness of light to be emitted by the sub-pixels P(4,6), P(4,7), and P(4,8), is applied to the data lines D6 to D8, the brightness of light emitted by the sub-pixels P(4,6), P(4,7), and P(4,8) may be determined according to the applied data signal.

Other than the main scan lines MS2 to MS4, the sub scan lines SS3 and SS4, and the data lines D6 to D8, driving voltage lines P6 to P8 are also illustrated in FIG. 3. The display apparatus, according to an exemplary embodiment of the inventive concept, includes driving voltage lines that extend in the y-axis direction and are parallel to each other across the first and second display areas. The driving voltage lines D6 to D8 transmit electric signals that are required for emission of the sub-pixels P(3,6), P(3,7), P(3,8), P(4,6), P(4,7), and P(4,8) to the sub-pixels P(3,6), P(3,7), P(3,8), P(4,6), P(4,7), and P(4,8).

The first data line pads DLP1 may be located in the second peripheral area PA2 of the substrate Sub instead of the display area DA of the substrate Sub so that the data signal may be applied to the first data lines DL1, as shown in FIG. 1. The first data line pads DLP1 may be located at a side (e.g., −y direction) of the first data lines DL1 so that the first data line pads DLP1 may be connected to the first data lines DL1. The second data line pads DLP2 may be located in the second peripheral area PA2 of the substrate Sub instead of the display area DA of the substrate Sub so that the data signal may be applied to the second data lines DL2, as shown in FIG. 1. The second data line pads DLP2 may be disposed at a side (e.g., −y direction) of the second data lines DL2 so that the second data line pads DLP2 may be connected to the second data lines DL2.

The first data line pads DLP1 may refer only to elements located in the second peripheral area PA2 and extended in parallel to the y-axis direction, as shown in FIG. 1. In this case, the first data line pads DLP1 and the first data lines DL1 may be connected via connection wires that are not parallel to the x-axis or the y-axis in FIG. 1. The connection wires may be disposed on a layer on which the first data line pads DLP1 and the first data lines DL1 are disposed, or on a layer which is different from the layer on which the first data line pads DLP1 and the first data lines DL1 are disposed. The connection wires may be electrically connected to the first data line pads DLP1 and the first data lines DL1 via contact holes. A similar structure may also be applied to the second data line pads DLP2 and connection wires that connect the second data line pads DLP2 and the second data lines DL2. For example, the connection wires that connect the second data line pads DLP2 and the second data lines DL2 may be disposed on a layer on which the second data line pads DLP2 and the second data lines DL2 are located, or on a layer which is different from the layer on which the second data line pads DLP2 and the second data lines DL2 are disposed. The connection wires may be electrically connected to the second data line pads DLP2 and the second data lines DL2 via contact holes.

The scan line pads SLP may be disposed at the second peripheral area PA2 of the substrate Sub instead of the display area DA of the substrate Sub so that the scan signal may be applied to the main scan lines MSL, as shown in FIG. 2. The scan line pads SLP may be disposed at a side (e.g., -y direction) of the main scan lines MSL so that the scan line pads SLP may be connected to the main scan lines MSL. The scan line pads SLP may be disposed between the first and second data line pads DLP1 and DLP2.

A scan driver circuit SDU may be disposed between the main scan lines MSL and the scan line pads SLP. The main scan lines MSL and the scan line pads SLP may be electrically connected to the scan driver circuit SDU. The scan driver circuit SDU includes, for example, a shift register, and may also include TFTs that are simultaneously formed when forming TFTs that are included in sub-pixels in the display area DA.

The scan driver circuit SDU may operate in various ways according to a method of driving the display apparatus. For example, scan signals may be sequentially applied to the main scan lines MS1 to MS16 so that the scan signals may be sequentially applied to the sub scan lines SS1 to SS16. Accordingly, sub-pixels electrically connected to the sub scan line SS1 may be selected, sub-pixels electrically connected to the sub scan line SS2, sequentially, until sub-pixels electrically connected to the sub scan line SS16 are selected. In this case, the scan line pads SLP may be components to which high signals, low signals, and/or clock signals, which are required by TFTs in the scan driver circuit SDU, are applied.

The scan driver circuit SDU may be configured in various ways. For example, as shown in FIG. 2, the scan driver circuit SDU may include a first scan driver circuit SDU1 electrically connected to the first main scan lines MSL1, and a second scan driver circuit SDU2 electrically connected to the second main scan lines MSL2. In this case, the first scan line pads SLP1 may be electrically connected to the first scan driver circuit SDU1, and the second scan line pads SLP2 may be electrically connected to the second scan driver circuit SDU2.

An integrated circuit (IC) or a printed circuit board (PCB), to which the IC is attached, may be attached to the first data line pads DLP1, the second data line pads DLP2, and the scan line pads SLP. Accordingly, an electric signal that passes through the IC may be input to the first data line pads DLP1, the second data line pads DLP2, and the scan line pads SLP, and thus, an image is displayed in the display area DA.

Hereinafter, a configuration of each of the sub-pixels will be described.

Figure 4:
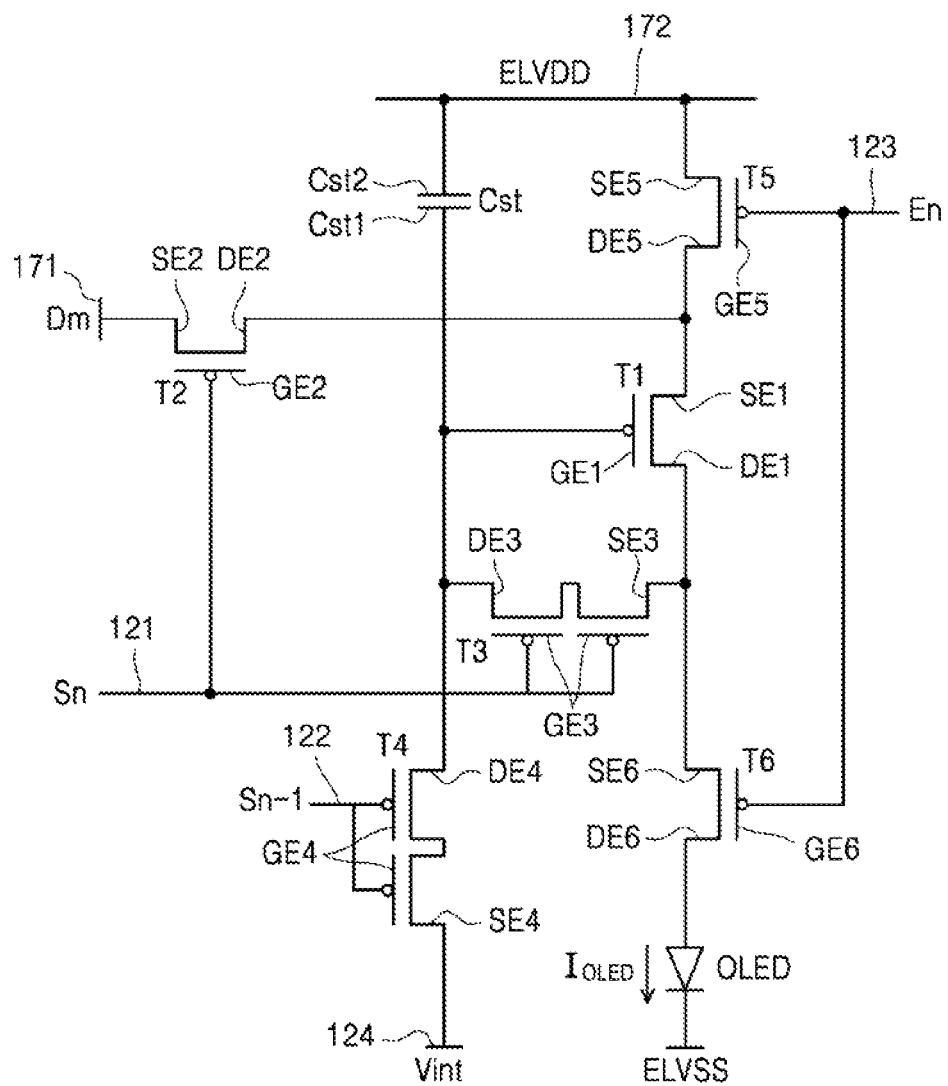
FIG. 4 is an equivalent circuit diagram illustrating a sub-pixel of the display apparatus of FIG. 1, according to an exemplary embodiment of the inventive concept.

FIG. 4 is an equivalent circuit diagram illustrating a sub-pixel of the display apparatus of FIG. 1, according to an exemplary embodiment of the inventive concept. As shown in FIG. 4, a sub-pixel of an organic light-emitting display apparatus, according to an exemplary embodiment of the inventive concept, includes a plurality of signal lines 121, 122, 123, 124, 171, and 172, a plurality of TFTs T1 to T6 connected to the signal lines 121, 122, 123, 124, 171, and 172, a storage capacitor Cst, and an OLED. The signal lines 121, 122, 123, 124, 171, and 172 may be shared between a plurality of sub-pixels.

The TFTs include a driving TFT T1, a switching TFT T2, a compensation TFT T3, an initialization TFT T4, an operation control TFT T5, and an emission control TFT T6.

The signal lines include a scan line 121 transmitting scan signals Sn, a previous scan line 122 transmitting a previous scan signal Sn-1 to the initialization TFT T4, an emission control line 123 transmitting an emission control signal En to the operation control TFT T5 and the emission control TFT T6, a data line 171 intersecting the scan line 121 and transmitting a data signal Dm, a driving voltage line 172 transmitting a driving voltage ELVDD and substantially in parallel with the data line 171, and an initialization voltage line 124 transmitting an initialization voltage Vint that initializes the driving TFT T1. The scan line 121 or the previous scan line 122 may be connected to the sub scan lines SS1 to SS16 or included in a portion of the sub scan lines SS1 to SS16 described above with reference to FIGS. 1 to 3. According to a location of a sub-pixel connected to the data line 171, the data line 171 may be one of the first data lines DL1 or one of the second data lines DL2.

A gate electrode GE1 of the driving TFT T1 is connected to a first storage capacitor plate Cst1 of the storage capacitor Cst, a source electrode SE1 of the driving TFT T1 is connected with the driving voltage line 172 via the operation control TFT T5, and a drain electrode DE1 of the driving TFT T1 is electrically connected with a pixel electrode of the OLED via the emission control TFT T6. The driving TFT T1 receives the data signal Dm according to a switching operation of the switching TFT T2 and supplies driving current $I_{OLED}$ to the OLED.

A gate electrode GE2 of the switching TFT T2 is connected to the scan line 121, a source electrode SE2 of the switching TFT T2 is connected to the data line 171, and a drain electrode DE2 of the switching TFT T2 is connected to the source electrode SE1 of the driving TFT T1 and to the driving voltage line 172 via the operation control TFT T5. The switching TFT T2 is turned on by the scan signals Sn received via the scan line 121, and performs a switching operation including transmitting the data signal Dm received via the data line 171 to the source electrode SE1 of the driving TFT T1.

A gate electrode GE3 of the compensation TFT T3 is connected to the scan line 121, a source electrode SE3 of the compensation TFT T3 is connected to the drain electrode DE1 of the driving TFT T1 and to the pixel electrode of the OLED via the emission control TFT T6, and a drain electrode DE3 of the compensation TFT T3 is connected to the first storage capacitor plate Cst1 of the storage capacitor Cst, a drain electrode DE4 of the initialization TFT T4, and the gate electrode GE1 of the driving TFT T1. The compensation TFT T3 is turned on by the scan signals Sn received via the scan line 121, electrically connects the gate electrode GE1 and the drain electrode DE1 of the driving TFT T1, and thus, diode-connects the driving TFT T1.

A gate electrode GE4 of the initialization TFT T4 is connected to the previous scan line 122, a source electrode SE4 of the initialization TFT T4 is connected with the initialization voltage line 124, and the drain electrode DE4 of the initialization TFT T4 is connected to the first storage capacitor plate Cst1 of the storage capacitor Cst, the drain electrode DE3 of the compensation TFT T3, and the gate electrode GE1 of the driving TFT T1. The initialization TFT T4 is turned on by the previous scan signal Sn-1 received via the previous scan line 122, and performs an initialization operation. For example, the initialization TFT T4 initializes a voltage of the gate electrode GE1 of the driving TFT T1 by transmitting the initialization voltage Vint to the gate electrode GE1 of the driving TFT T1.

A gate electrode GE5 of the operation control TFT T5 is connected to the emission control line 123, a source electrode SE5 of the operation control TFT T5 is connected to the driving voltage line 172, and a drain electrode DE5 of the operation control TFT T5 is connected to the source electrode SE1 of the driving TFT T1 and the drain electrode DE2 of the switching TFT T2.

A gate electrode GE6 of the emission control TFT T6 is connected to the emission control line 123, a source electrode SE6 of the emission control TFT T6 is connected to the drain electrode DE1 of the driving TFT T1 and the source electrode SE3 of the compensation TFT T3, and a drain electrode DE6 of the emission control TFT T6 is electrically connected with the pixel electrode of the OLED. The operation control TFT T5 and the emission control TFT T6 are turned on at the same time by the emission control signal En received via the emission control line 123, and the driving voltage ELVDD is transmitted to the OLED, and the driving current $I_{OLED}$ flows in the OLED.

A second storage capacitor plate Cst2 of the storage capacitor Cst is connected to the driving voltage line 172, and an opposite electrode of the OLED is connected to a common voltage ELVSS. Thus, the OLED displays an image by emitting light with the driving current $I_{OLED}$ received from the driving TFT T1.

Hereinafter, operations of the sub-pixel of the organic light-emitting display apparatus will be described, according to an exemplary embodiment of the inventive concept.

During an initialization period, a low level previous scan signal Sn-1 is supplied via the previous scan line 122. Then, the initialization TFT T4 is turned on according to the low level previous scan signal Sn-1, and the initialization voltage Vint from the initialization voltage line 124 is transmitted to the gate electrode GE1 of the driving TFT T1 via the initialization TFT T4. Thus, the driving TFT T1 is initialized by the initialization voltage Vint.

During a data programming period, a low level scan signal Sn is supplied via the scan line 121. Then, the switching TFT T2 and the compensation TFT T3 are turned on according to the low level scan signals Sn. Thus, the driving TFT T1 is diode-connected by the turned on compensation TFT T3, and forward biased. Then, the data signal Dm supplied from the data line 171 minus a threshold voltage of the driving TFT T1, for example, a compensation voltage (Dm+the threshold voltage of the driving TFT T1, where the threshold voltage of the driving TFT T1 is a negative (−) value) is applied to the gate electrode GE1 of the driving TFT T1. The driving voltage ELVDD and the compensation voltage (Dm+the threshold voltage of the driving TFT T1) are applied to the two ends of the storage capacitor Cst. Thus, the storage capacitor Cst stores an electric charge corresponding to a voltage difference between the driving voltage ELVDD and the compensation voltage.

The emission control signal En, which is supplied from the emission control line 123 during an emission period, is changed from a high level to a low level. Since the operation control TFT T5 and the emission control TFT T6 are turned on by the low level emission control signal En, the driving current $I_{OLED}$, which is determined according to a voltage difference between a voltage of the gate electrode GE1 of the driving TFT T1 and the driving voltage ELVDD, is generated. The driving current $I_{OLED}$ is supplied to the OLED via the emission control TFT T6. During the emission period, a gate-source voltage of the driving TFT T1 is maintained as (Dm+the threshold voltage of the driving TFT T1)-ELVDD by the storage capacitor Cst. Based on a current-voltage relationship of the driving TFT T1, since the driving current $I_{OLED}$ is relative to $(Dm-ELVDD)^2$, a squared value of the gate-source voltage of the driving TFT T1 minus the threshold voltage of the driving TFT T1, the driving current $I_{OLED}$ is determined regardless of the threshold value Vth of the driving TFT T1.

Hereinafter, a detailed structure of the sub-pixel of the organic light-emitting display apparatus of FIG. 4 will be described with reference to FIGS. 5 to 9.

Figure 5:
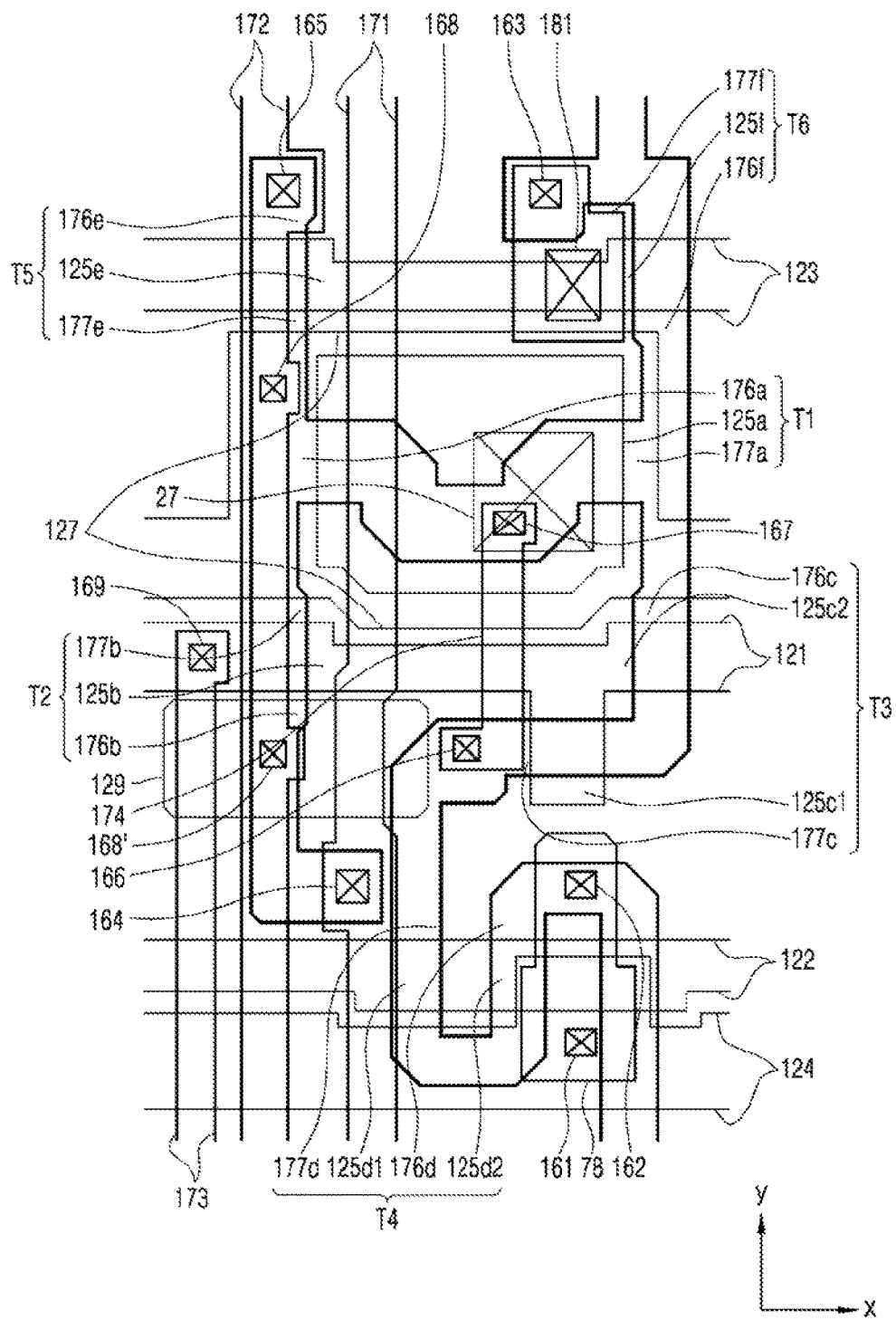
FIG. 5 is a layout diagram illustrating locations of a plurality of thin film transistors (TFTs), a capacitor, and other elements of the sub-pixel of FIG. 4, according to an exemplary embodiment of the inventive concept.

FIG. 5 is a layout diagram illustrating locations of a plurality of thin film transistors (TFTs), a capacitor, and other elements of the sub-pixel of FIG. 4, according to an exemplary embodiment of the inventive concept. FIGS. 6 to 9 are layout diagrams illustrating components of the plurality of TFTs and the capacitor of FIG. 5 according to a layer in which they are disposed, according to an exemplary embodiment of the inventive concept. For example, FIGS. 6 to 9 illustrate layouts of wires or semiconductor layers disposed on a same layer (e.g., the layer illustrated in the respective figure). An insulating layer may be provided between structures on layers illustrated in FIGS. 6 to 9. For example, a first insulating layer may be provided between the layer shown in FIG. 6 and the layer shown in FIG. 7, a second insulating layer may be provided between the layer shown in FIG. 7 and the layer shown in FIG. 8, and an interlayer insulating layer may be provided between the layer shown in FIG. 8 and the layer shown in FIG. 9. Contact holes may be formed in the insulating layers to electrically and vertically connect the structures on the layers shown in FIGS. 6 to 9.

The sub-pixel of the organic light-emitting display apparatus, according to an exemplary embodiment of the inventive concept, includes the scan line 121, the previous scan line 122, the emission control line 123, and the initialization voltage line 124 which are formed in a row direction and respectively apply the scan signals Sn, the previous scan signal Sn-1, the emission control signal En, and the initialization voltage Vint. The sub-pixel of the organic light-emitting display apparatus, according to an exemplary embodiment of the inventive concept, may include the data line 171 and the driving voltage line 172 that intersect the scan line 121, the previous scan line 122, the emission control line 123, and the initialization voltage line 124, and respectively apply the data signal Dm and the driving voltage ELVDD to the sub-pixel.

The sub-pixel may include the driving TFT T1, the switching TFT T2, the compensation TFT T3, the initialization TFT T4, the operation control TFT T5, the emission control TFT T6, the storage capacitor Cst, and the OLED.

Figure 6:
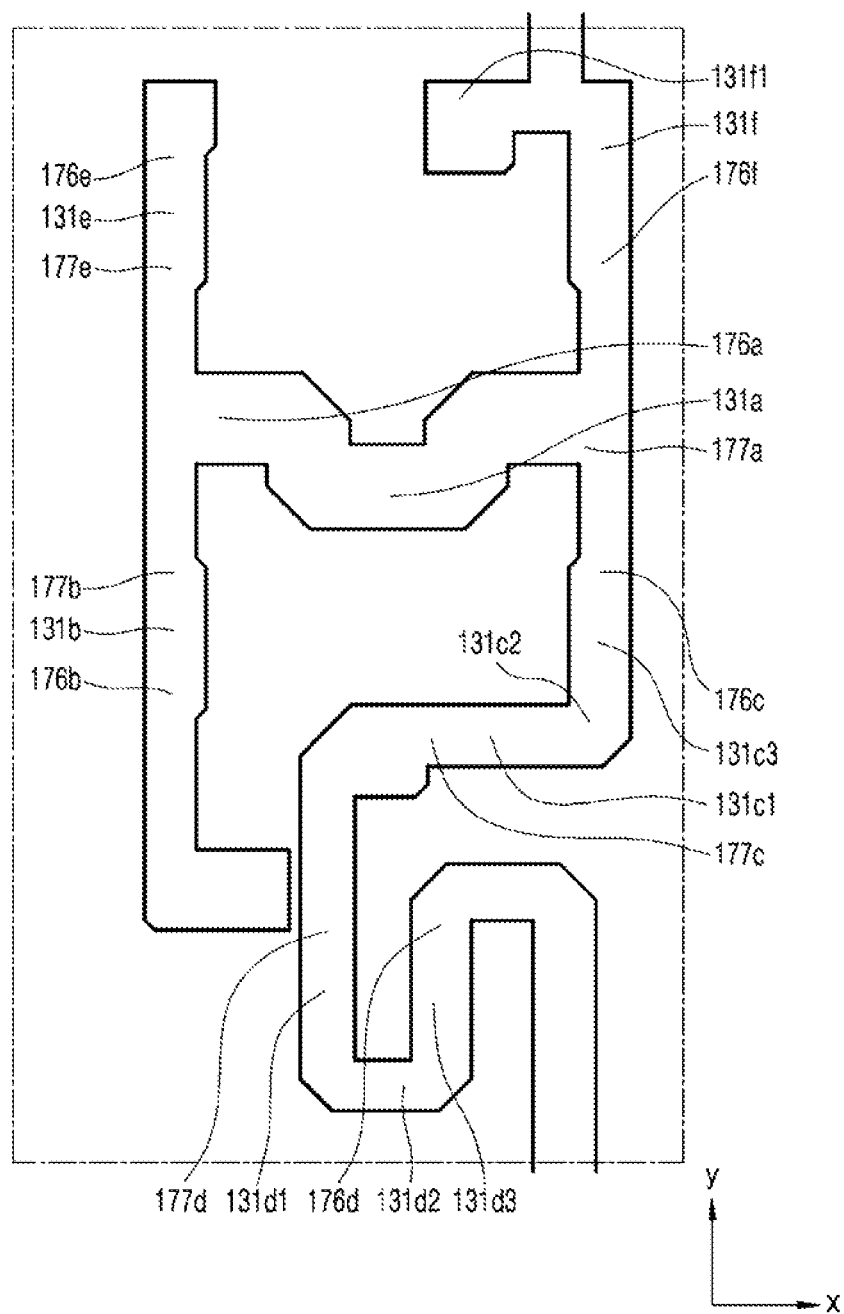
FIGS. 6 to 9 are layout diagrams illustrating components of the plurality of TFTs and the capacitor of FIG. 5 according to a layer in which they are disposed, according to an exemplary embodiment of the inventive concept.

The driving TFT T1, the switching TFT T2, the compensation TFT T3, the initialization TFT T4, the operation control TFT T5, and the emission control TFT T6 are formed along semiconductor layers shown in FIG. 6, which are curved in various ways. The semiconductor layers may include a driving semiconductor layer 131a that corresponds to the driving TFT T1, a switching semiconductor layer 131b that corresponds to the switching TFT T2, compensation semiconductor layers 131c1, 131c2, and 131c3 that correspond to the compensation TFT T3, initialization semiconductor layers 131d1, 131d2, and 131d3 that correspond to the initialization TFT T4, an operation control semiconductor layer 131e that corresponds to the operation control TFT T5, and an emission control semiconductor layer 131f that corresponds to the emission control TFT T6. The driving semiconductor layer 131a, the switching semiconductor layer 131b, the compensation semiconductor layers 131c1, 131c2, and 131c3, the initialization semiconductor layers 131d1, 131d2, and 131d3, the operation control semiconductor layer 131e, and the emission control semiconductor layer 131f may be portions of the semiconductor layers shown in FIG. 6.

The semiconductor layers may include polysilicon. In addition, the semiconductor layers may include, for example, a channel area that is not doped with impurities and a source area and a drain area on both sides of the channel area that are formed by doping impurities. The impurities may vary according to a type of the TFT, and an N-type impurity or a P-type impurity may be used. Also, the source area or the drain area formed by doping may be a source electrode or a drain electrode of a TFT. For example, in the semiconductor layer shown in FIG. 6, a driving source electrode 176a may correspond to a driving source area 176a that is formed by doping impurities near the driving semiconductor layer 131a, and a driving drain electrode 177a may correspond to a driving drain area 177a that is formed by doping impurities near the driving semiconductor layer 131a. Also, in the semiconductor layer shown in FIG. 6, portions of the semiconductor layer between the TFTs may be doped with impurities and function as wires that electrically connect the TFTs.

The storage capacitor Cst may include a first storage capacitor plate 125a and a second storage capacitor plate 127 with a second insulating layer therebetween. The first storage capacitor plate 125a may also function as a driving gate electrode of the driving TFT T1. Accordingly, the driving gate electrode of the driving TFT T1 and the first storage capacitor plate 125a may be integrally formed. Hereinafter, for convenience of description, the driving gate electrode of the driving TFT T1 may be referred to by the same reference numeral as the first storage capacitor plate 125a.

Figure 7:
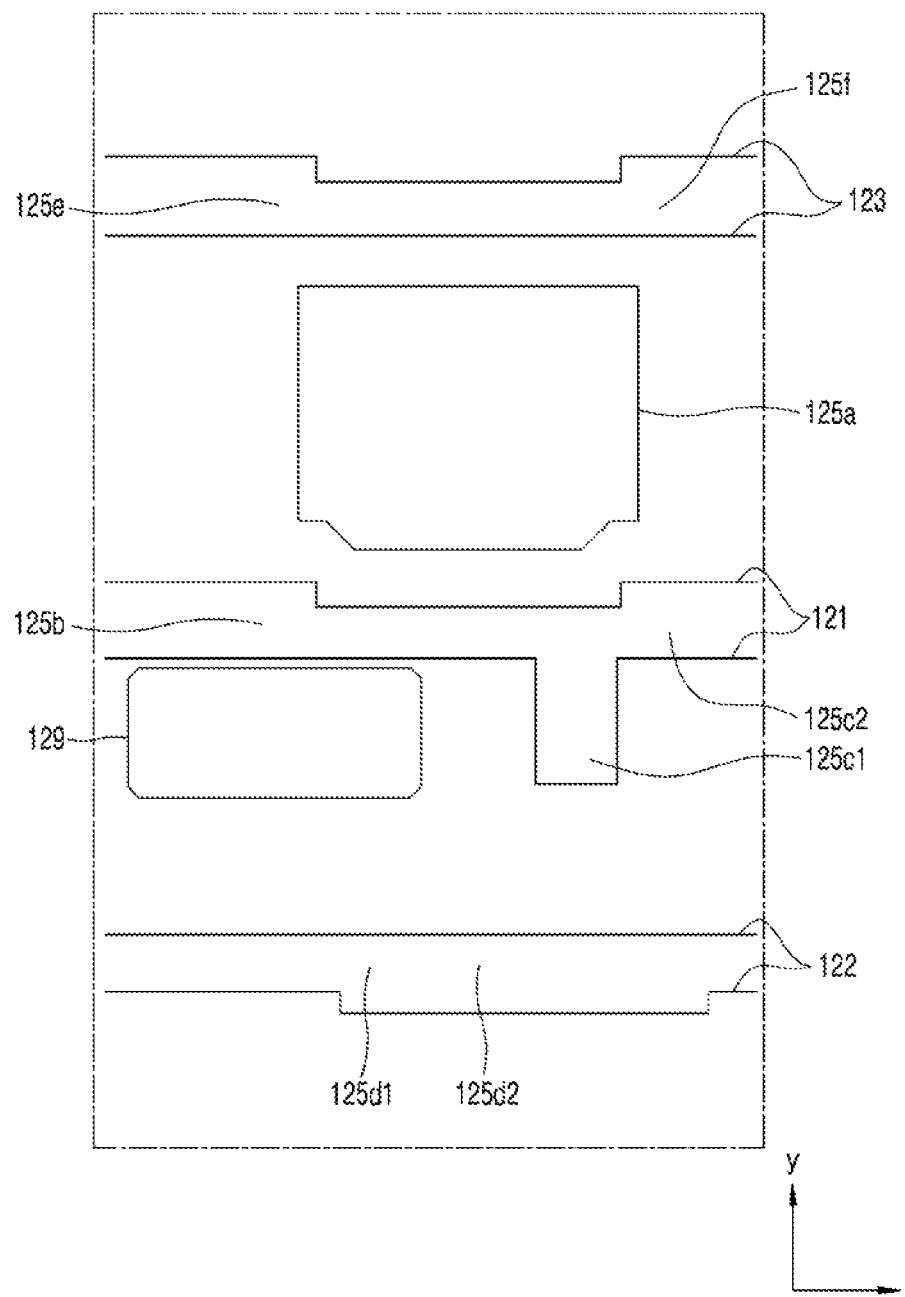

As shown in FIG. 7, the first storage capacitor plate 125a may be quadrilateral shaped and spaced apart from an adjacent sub-pixel. The first storage capacitor plate 125a may be formed on a layer on which the scan line 121, the previous scan line 122, and the emission control line 123 are located, and the first storage capacitor plate 125a, the scan line 121, the previous scan line 122, and the emission control line 123 may be formed simultaneously using the same material.

A switching gate electrode 125b and compensation gate electrodes 125c1 and 125c2 are portions of the scan line 121 that intersect the semiconductor layers or portions that protrude from the scan line 121. Initialization gate electrodes 125d1 and 125d2 are portions of the previous scan line 122 that intersect the semiconductor layers or portions that protrude from the previous scan line 122. An operation control gate electrode 125e and an emission control gate electrode 125f are portions of the emission control line 123 that intersect the semiconductor layers or portions that protrude from the emission control line 123.

Figure 8:
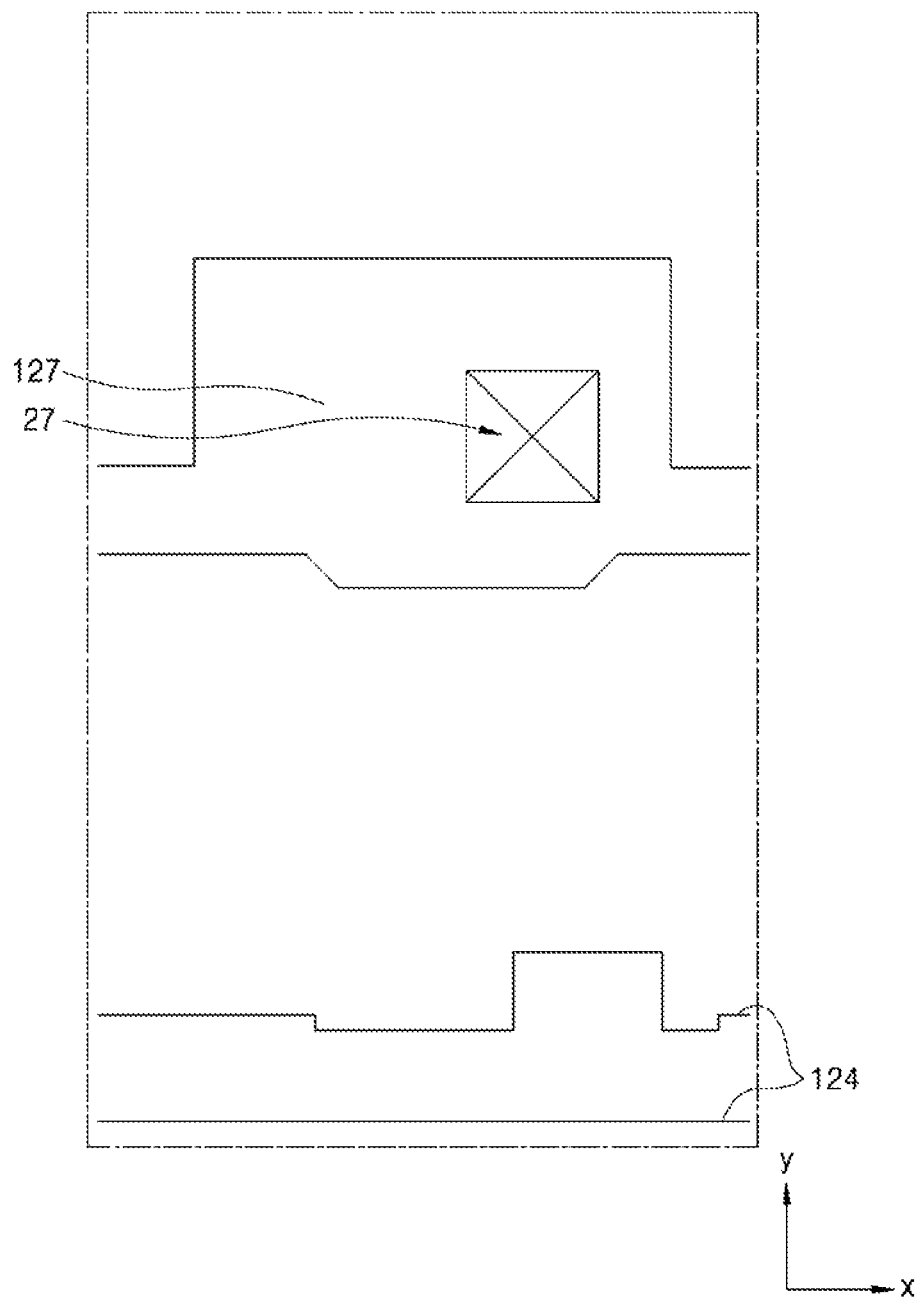

The second storage capacitor plate 127 of the sub-pixel and a second storage capacitor plate of an adjacent sub-pixel may be formed integrally. As shown in FIG. 8, the second storage capacitor plate 127 may be formed on a layer on which the initialization voltage line 124 is located (e.g., disposed on), and the second storage capacitor plate 127 and the initialization voltage line 124 may be formed simultaneously using the same material. A storage opening 27 may be formed in the second storage capacitor plate 127. A connector 174 may electrically connect the first storage capacitor plate 125a and a drain electrode 177c of the compensation TFT T3 via the storage opening 27, which will be described below. The second storage capacitor plate 127 may be connected to the driving voltage line 172 via a contact hole 168 formed in the interlayer insulating layer.

The driving TFT T1 includes the driving semiconductor layer 131a, a driving gate electrode 125a, the driving source electrode 176a, and the driving drain electrode 177a. As described above, the driving gate electrode 125a may also function as the first storage capacitor plate 125a. The driving source electrode 176a is disposed in an outer portion (−x direction in FIG. 3) of the driving gate electrode 125a, and the driving drain electrode 177a is disposed in an outer portion of the driving gate electrode 125a (+x direction in FIG. 3). The driving source electrode 176a and the driving drain electrode 177a are disposed at opposite sides of the driving gate electrode 125a.

The switching TFT T2 includes the switching semiconductor layer 131b, the switching gate electrode 125b, a switching source electrode 176b, and a switching drain electrode 177b. The switching source electrode 176b may be electrically connected with the data line 171 via a contact hole 164 formed in the first insulating layer, the second insulating layer, and the interlayer insulating layer. If necessary, a portion of the data line 171 near the contact hole 164 may function as a source electrode of the switching TFT T2. The switching drain electrode 177b corresponds to a switching drain area 177b formed by doping impurities near the switching semiconductor layer 131b.

The compensation TFT T3 includes the compensation semiconductor layers 131c1, 131c2, and 131c3, the compensation gate electrodes 125c1 and 125c2, a compensation source electrode 176c, and the compensation drain electrode 177c. The compensation source electrode 176c corresponds to a compensation source area 176c that is formed by doping impurities near the compensation semiconductor layers 131c1, 131c2, and 131c3. The compensation drain electrode 177c corresponds to a compensation drain area 177c that is formed by doping impurities near the compensation semiconductor layers 131c1, 131c2, and 131c3. The compensation gate electrodes 125c1 and 125c2 are dual gate electrodes including a first gate electrode 125c1 and a second gate electrode 125c2 and may prevent or reduce leakage current. The compensation drain electrode 177c of the compensation TFT T3 may be connected with the first storage capacitor plate 125a by using the connector 174. The compensation semiconductor layers 131c1, 131c2, and 131c3 may include a portion 131c1 corresponding to the first gate electrode 125c1, a portion 131c3 corresponding to the second gate electrode 125c2, and a portion 131c2 between the two portions 131c1 and 131c3.

Figure 9:
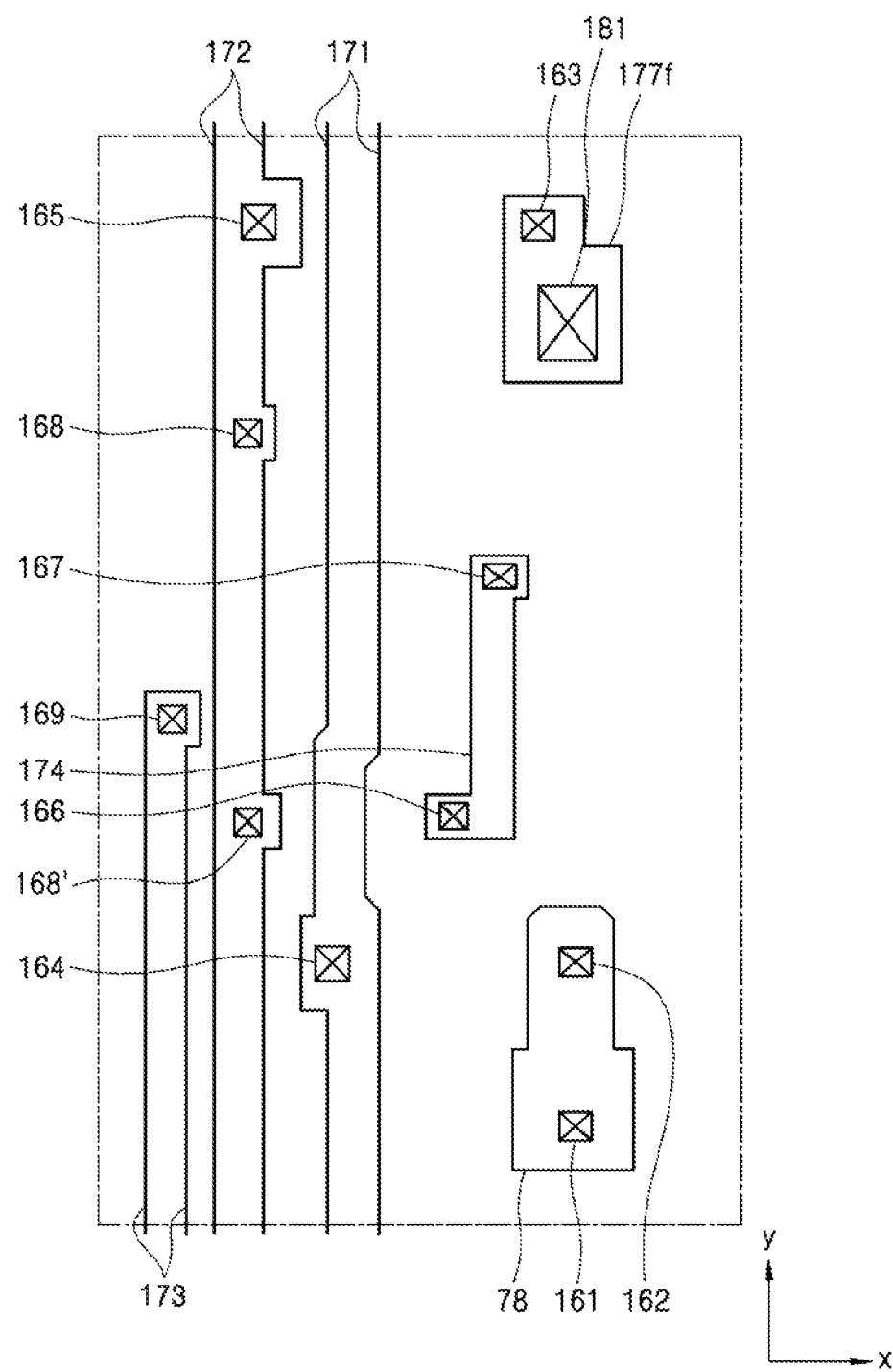

As shown in FIG. 9, the connector 174 may be formed on a same layer on which the data line 171 is located, and the connector 174 and the data line 171 may be formed simultaneously using the same material. An end of the connector 174 is connected with the compensation drain electrode 177c and an initialization drain electrode 177d via a contact hole 166 formed in the first insulating layer, the second insulating layer, and the interlayer insulating layer. Another end of the connector 174 is connected with the first storage capacitor plate 125a via a contact hole 167 formed in the second insulating layer and the interlayer insulating layer. The other end of the connector 174 is connected with the first storage capacitor plate 125a via the storage opening 27 formed in the second storage capacitor plate 127.

The initialization TFT T4 includes the initialization semiconductor layers 131d1, 131d2, and 131d3, the initialization gate electrodes 125d1 and 125d2, an initialization source electrode 176d, and the initialization drain electrode 177d. The initialization drain electrode 177d corresponds to an initialization drain area 177d formed by doping impurities near the initialization semiconductor layers 131d1, 131d2, and 131d3.

The initialization source electrode 176d is connected with the initialization voltage line 124 via an initialization connection line 78. An end of the initialization connection line 78 is connected with the initialization voltage line 124 via a contact hole 161 formed in the second insulating layer and the interlayer insulating layer. Another end of the initialization connection line 78 may be connected with the initialization source electrode 176d via a contact hole 162 formed in the first insulating layer, the second insulating layer, and the interlayer insulating layer.

The operation control TFT T5 includes the operation control semiconductor layer 131e, the operation control gate electrode 125e, an operation control source electrode 176e, and an operation control drain electrode 177e. The operation control source electrode 176e may be electrically connected with the driving voltage line 172 via a contact hole 165 formed in the first insulating layer, the second insulating layer, and the interlayer insulating layer. If necessary, a portion of the driving voltage line 172 near the contact hole 165 may function as a source electrode of the operation control TFT T5. The operation control drain electrode 177e corresponds to an operation control drain area 177e that is formed by doping impurities near the operation control semiconductor layer 131e.

The emission control TFT T6 includes the emission control semiconductor layer 131f, the emission control gate electrode 125f, an emission control source electrode 176f, and an emission control drain electrode 177f. The emission control source electrode 176f corresponds to an emission control source area 176f formed by doping impurities near the emission control semiconductor layer 131f. As shown in FIG. 9, the emission control drain electrode 177f is a portion on the interlayer insulating layer formed with the data line 171 or the driving voltage line 172. The emission control drain electrode 177f may be connected to a lower semiconductor layer via a contact hole 163 formed in the first insulating layer, the second insulating layer, and the interlayer insulating layer. Alternatively, a portion of the lower semiconductor layer may include an emission control drain electrode, and the reference numeral 177f may indicate an intermediate connection layer for connecting the emission control drain electrode and a pixel electrode of the OLED.

An end of the driving semiconductor layer 131a of the driving TFT T1 is connected with the switching semiconductor layer 131b and the compensation semiconductor layers 131c1, 131c2, and 131c3. Another end of the driving semiconductor layer 131a is connected with the operation control semiconductor layer 131e and the emission control semiconductor layer 131f. Therefore, the driving source electrode 176a is connected with the switching drain electrode 177b and the operation control drain electrode 177e, and the driving drain electrode 177a is connected with the compensation source electrode 176c and the emission control source electrode 176f.

The switching TFT T2 is used as a switching device that selects a sub-pixel for emitting light. The switching gate electrode 125b is connected with the scan line 121, the switching source electrode 176b is connected with the data line 171, and the switching drain electrode 177b is connected with the driving TFT T1 and the operation control TFT T5.

As shown in FIG. 9, the emission control drain electrode 177f of the emission control TFT T6 is connected with a pixel electrode of the OLED via a contact hole 181 formed in a protection layer or a planarization layer that covers, for example, the data line 171 or the driving voltage line 172.

As shown in FIGS. 5 and 7, a shield layer 129 may be located on a layer which is different from a layer on which the driving voltage line 172 is located, such that the shield layer 129 overlaps at least one of the data line 171 and a main scan line 173. The shield layer 129 may be connected with the driving voltage line 172 via a contact hole 168' formed in the second insulating layer and the interlayer insulating layer. The shield layer 129 does not contact the data line 171 and the main scan line 173 that are disposed on the same layer on which the driving voltage line 172 is disposed. In addition, shield layer 129 is not electrically connected to the data line 171 and the main scan line 173. As shown in FIG. 7, the shield layer 129 may be disposed on a layer on which the scan line 121 is disposed. The shield layer 129 and the scan line 121 may be disposed under the data line 171, the main scan line 173, and the driving voltage line 172.

As described above, the main scan line 173 is electrically connected with the scan line 121 via the contact hole 169 formed in an insulating layer so that a plurality of sub-pixels arranged in series in the x-axis direction are selected. As described above, the scan line 121 can be any of the sub scan lines SS1 to SS16. The scan lines 121 extending in the x-axis direction are arranged in the y-axis direction such that they are parallel to one another, and electric signals are sequentially applied to the scan lines 121. This corresponds to sequentially applying electric signals to the main scan lines MSL extending in the y-axis direction, as shown in FIG. 2. As electric signals are applied to the main scan lines MSL, data signals of data lines (e.g., the data lines D1 to D16 of FIG. 1) near the main scan lines MSL are affected.

As shown in FIG. 5, the driving voltage line 172, to which constant electric signals are applied, may be provided (e.g., disposed) between the main scan line 173 and the data line 171 so that the data signals of the data line 171 are less affected by the electric signals applied to the main scan line 173. However, even in this case, stains may appear at locations indicated by the black dots in FIG. 2 or at locations near the black dots. The data signals of the data line 171 may be affected by the electric signals applied to the main scan line 173 due to a fringe effect at a location where the main scan line 173 and the scan line 121 are connected via the contact hole 169. As a result, brightness of OLEDs at the locations indicated by the black dots in FIG. 2 or sub-pixels near the black dots may be different from their intended brightness, and thus, an image displayed by an organic light-emitting display apparatus may have decreased quality.

However, since the organic light-emitting display apparatus, according to an exemplary embodiment of the inventive concept includes the shield layer 129, a decrease in image quality may be prevented or reduced. An effect caused by the electric signals of the main scan line 173 on the data signals of the data line 171 due to the fringe effect may be reduced or prevented by overlapping at least one of the data line 171 and the main scan line 173 with the shield layer 129. The shield layer 129 is electrically connected to the driving voltage line 172 to which constant electric signals are applied. Thus, the organic light-emitting display apparatus may display a good quality image. For example, by overlapping the data line 171 and the main scan line 173 with the shield layer 129, an effect caused by the electric signals of the main scan line 173 on the data signals of the data line 171 due to the fringe effect may be reduced. The shield layer 129 is electrically connected to the driving voltage line 172, to which constant electric signals are applied.

The display apparatus, according to an exemplary embodiment of the inventive concept, may include a display area DA without a protruding portion, a corner, or an angular outer perimeter, as shown in FIG. 1. For example, the display apparatus, according to an exemplary embodiment of the inventive concept may include a circular, oval-shaped or elliptical display area DA. Accordingly, a substrate of the display apparatus may have a circular, oval, or elliptical shape.

In a display apparatus having a circular, oval or elliptical shape, the scan driver circuit SDU and a data driving circuit may be located at an outer periphery of the display apparatus, as shown in FIG. 2. Therefore, as shown in FIG. 2, a plurality of sub-pixels are selected by intersecting main scan lines MSL and sub scan lines SSL. As described above, although an image quality may be decreased at or near the intersections of the main scan lines MSL and the sub scan lines SSL, the shield layer 129 may prevent or reduce the image quality from being decreased at or near the intersections of the main scan lines MSL and the sub scan lines SSL.

Figure 10:
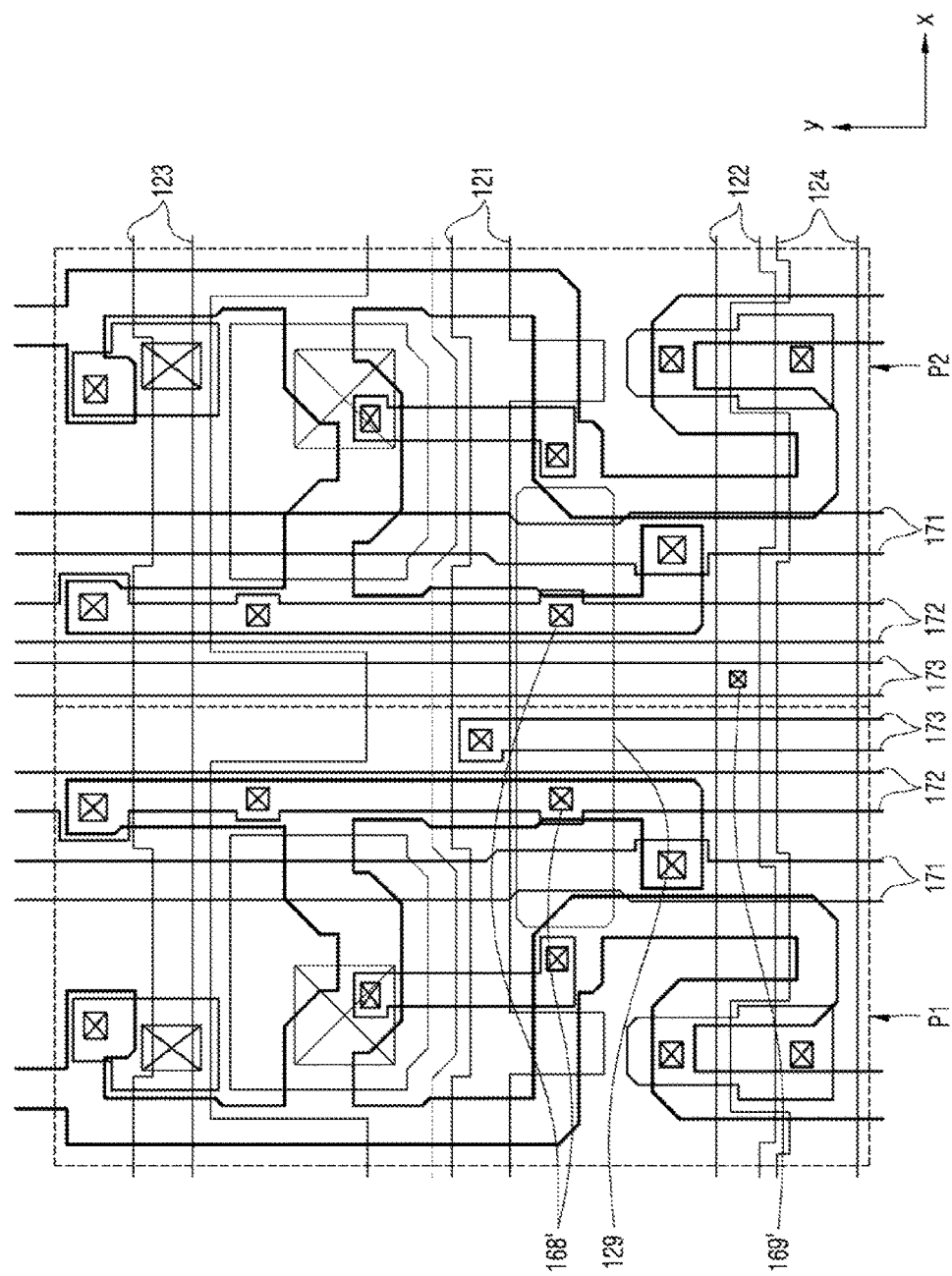
FIG. 10 is a layout diagram illustrating locations of a plurality of TFTs and a capacitor included in two sub-pixels of a display apparatus, according to an exemplary embodiment of the inventive concept.

FIG. 10 is a layout diagram illustrating locations of a plurality of TFTs and a capacitor included in two sub-pixels P1 and P2 of a display apparatus, according to an exemplary embodiment of the inventive concept. As shown in FIG. 10, the two sub-pixels P1 and P2 are adjacent to each other with an axis parallel to a direction in which the data line 171, the driving voltage line 172, and the main scan line 173 extend therebetween. Also, components other than the main scan line 173 of the two sub-pixels P1 and P2 are symmetrically arranged about the axis. The structure of the sub-pixel P1 shown in FIG. 10 is mirror symmetric to the structure of the sub-pixel of FIG. 5 based on an axis passing through the center of the sub-pixel of FIG. 5 and parallel to the y-axis.

When the components other than the main scan line 173 of the sub-pixels P1 and P2 form a symmetry based on the axis, the data line 171 of the sub-pixel P1 may be away from the main scan line 173 that passes the sub-pixel P2. Also, the data line 171 of the sub-pixel P2 may be away from the main scan line 173 that passes the sub-pixel P1. Accordingly, the data signals of the data line 171 of the sub-pixels P1 and P2 may be affected less or not affected by the main scan line 173. In addition, as shown in FIG. 10, the shield layer 129 may be integrally formed in the adjacent sub-pixels P1 and P2 to simplify the structure.

In FIG. 10, the sub-pixels P1 and P2 may be simultaneously selected by the scan line 121 that is connected to the main scan line 173 that passes the sub-pixel P1. Also, the main scan line 173 that passes the sub-pixel P2 may transmit electric signals for selecting sub-pixels in a +y direction of the sub-pixels P1 and P2. The main scan line 173 that passes the sub-pixel P2 may be connected to the previous scan line 122 of the sub-pixels P1 and P2 via a contact hole 169' and transmit the previous scan signal Sn-1 to the previous scan line 122 of the sub-pixels P1 and P2.

Figure 11:
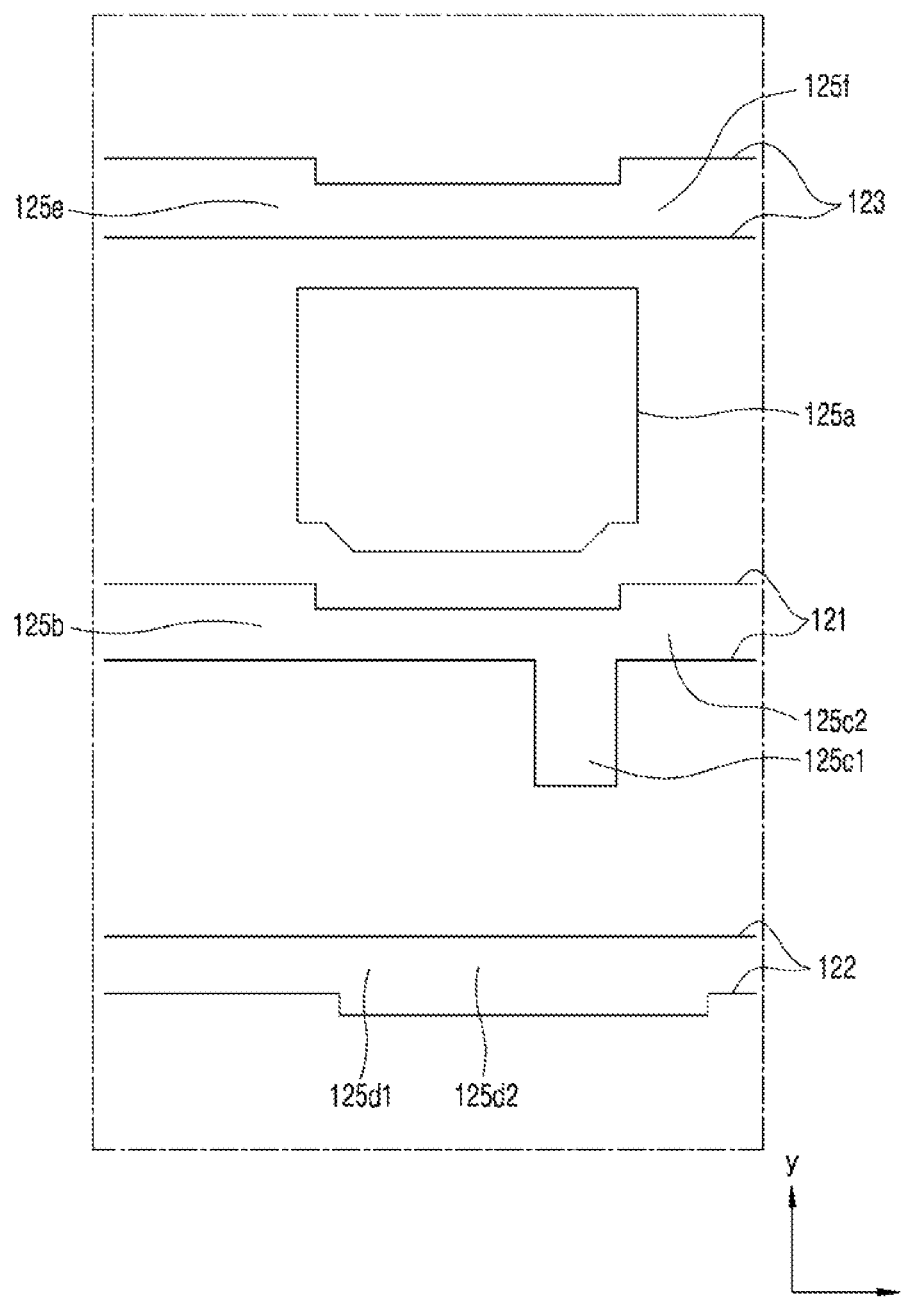
FIGS. 11 to 13 are layout diagrams illustrating components of a plurality of TFTs and the capacitor included in a sub-pixel of a display apparatus according to a layer in which they are disposed, according to an exemplary embodiment of the inventive concept.
Figure 12:
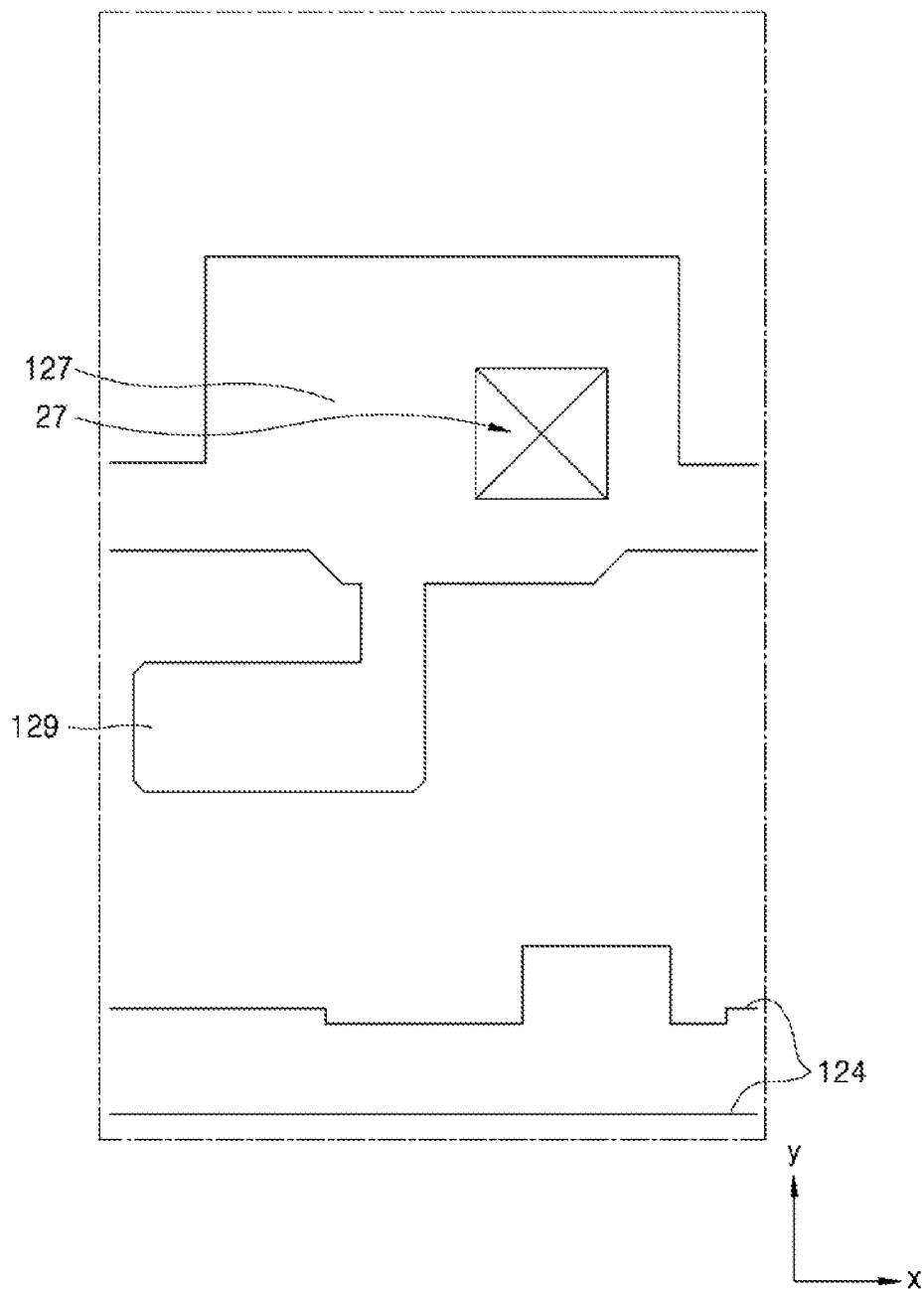
Figure 13:
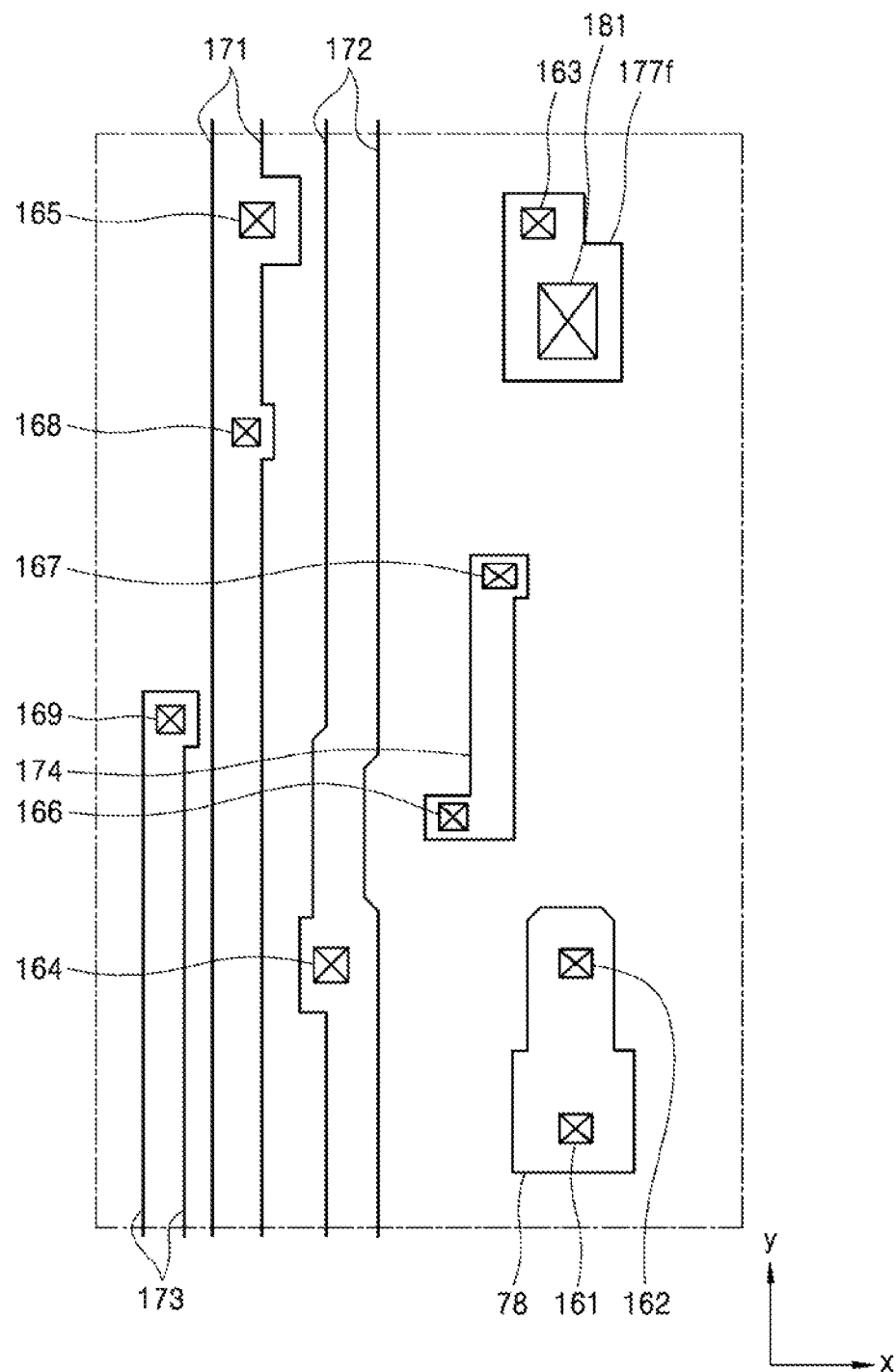

FIGS. 11 to 13 are layout diagrams illustrating components of a plurality of TFTs and a capacitor included in a sub-pixel of a display apparatus according to a layer in which they are disposed, according to an exemplary embodiment of the inventive concept. The sub-pixel of the display apparatus, according to an exemplary embodiment of the inventive concept, may also be illustrated as the equivalent circuit diagram of FIG. 4. The sub-pixel of the display apparatus may have a structure in which the semiconductor layer shown in FIG. 6 and a layer shown in FIG. 11 have a first insulating layer disposed therebetween, the layer shown in FIG. 11 and a layer shown in FIG. 12 have a second insulating layer disposed therebetween, and the layer shown in FIG. 12 and a layer shown in FIG. 13 have an interlayer insulating layer disposed therebetween.

In the display apparatus, according to an exemplary embodiment of the inventive concept, described with reference to FIGS. 5 to 9, the shield layer 129 is disposed on a layer on which the scan line 121 is disposed, as shown in FIG. 7. However, in the display apparatus, according to an exemplary embodiment of the inventive concept, the shield layer 129 may be disposed on a layer on which the second storage capacitor plate 127 is disposed, as shown in FIG. 12. The second storage capacitor plate 127 is disposed is above the first storage capacitor plate 125a. In this case, the shield layer 129 may be included in a portion of the second storage capacitor plate 127. The second storage capacitor plate 127 is located under the data line 171, the main scan line 173, and the driving voltage line 172.

The second storage capacitor plate 127 may be connected with the driving voltage line 172, to which constant electric signals are applied, via the contact hole 168 formed in an interlayer insulating layer. Therefore, constant electric signals are also applied to the shield layer 129, which is included in a portion of the second storage capacitor plate 127. By overlapping at least one of the data line 171 and the main scan line 173 with the shield layer 129, an effect caused by the electric signals of the main scan line 173 on the data signals of the data line 171 due to the fringe effect may be reduced or prevented. Accordingly, a high quality image may be displayed by the organic light-emitting display apparatus. In this case, since a contact hole is not additionally required to connect the shield layer 129 and the driving voltage line 172, a structure of the display apparatus may be simplified.

The display apparatus, according to an exemplary embodiment of the inventive concept, may be modified in various ways, for example, the display apparatus may include the shield layer 129 shown in FIG. 7 and the shield layer 129 shown in FIG. 12. Also, unlike the description above, an island type semiconductor layer that is spaced apart from an integrally formed semiconductor layer shown in FIG. 6 may be further included. The island type semiconductor layer may be doped and be conductive, and the island type semiconductor layer may be connected with the driving voltage line 172 via a contact hole. The island type semiconductor layer may overlap at least one of the data line 171 and the main scan line 173 to function as a shield layer.

Although the shield layer 129 is described as being disposed under the data line 171 and the main scan line 173, the inventive concept is not limited thereto. For example, the shield layer 129 may be disposed above the data line 171 and the main scan line 173, above the data line 171 and under and the main scan line 173, or in other various forms.

The inventive concept is not limited to an organic light-emitting display apparatus. Other than the organic light-emitting display apparatus, any type of display apparatuses including a TFT in a sub-pixel and a data line may be implemented such that a shield layer is included in the same or similar manner as described above, and thus display high quality images.

It should be understood that the exemplary embodiments of the inventive concept described herein are to be considered in a descriptive sense only and not for purposes of limitation. Descriptions of features or aspects within an exemplary embodiment of the inventive concept should be considered as available for exemplary embodiments of the inventive concept described throughout the specification.

While exemplary embodiments have been described with reference to the accompanying drawings, it will be understood by those of ordinary skill in the art that various changes in form and details may be made therein without departing from the spirit and scope as defined by the following claims.

What is claimed is:

1. A display apparatus having a display area and a non-display area disposed in a periphery of the display apparatus, the display apparatus comprising:
    a data line extending in a first direction;
    a main scan line disposed substantially parallel to the data line;
    a sub scan line extending in a second direction that crosses the main scan line, wherein the sub scan line is electrically connected with the main scan line within the display area;
    a driving voltage line extending in the first direction and disposed between the data line and the main scan line; and
    a shield layer disposed on a layer that is different from a layer on which the driving voltage line is disposed, the shield layer being electrically connected with the driving voltage line, wherein the shield layer overlaps at least one of the data line and the main scan line.

2. The display apparatus of claim 1, wherein the data line, the main scan line, and the driving voltage line are disposed on a same layer.

3. The display apparatus of claim 2, wherein the shield layer is disposed on a layer on which the sub scan line is disposed.

4. The display apparatus of claim 3, wherein the sub scan line is disposed under the data line, the main scan line, and the driving voltage line.

5. The display apparatus of claim 2, further comprising a storage capacitor comprising a first storage capacitor plate and a second storage capacitor plate, the second storage capacitor plate overlapping the first storage capacitor plate and being disposed above the first storage capacitor plate,
    wherein the shield layer is a portion of the second storage capacitor plate.

6. The display apparatus of claim 5, wherein the second storage capacitor plate is disposed under the data line, the main scan line, and the driving voltage line.

7. The display apparatus of claim 1, wherein the shield layer overlaps each of the data line and the main scan line.

8. The display apparatus of claim 1, wherein two sub-pixels are disposed adjacent to each other symmetrically opposed between an axis parallel to the first direction.

9. The display apparatus of claim 8, wherein the shield layer is integrally formed in the two adjacent sub-pixels.

10. The display apparatus of claim 1, wherein the display area does not include an angular portion in an outer periphery of the display area,
    wherein the data line, and the driving voltage line cross the display area.

11. The display apparatus of claim 1, wherein the display area is circular, oval, or elliptical-shaped,
    wherein the data line, and the driving voltage line cross the display area.

12. A display apparatus, comprising:
    a data line extending in a first direction;
    a main scan line disposed substantially parallel to the data line;
    a sub scan line extending in a second direction that crosses the main scan line, wherein the sub scan line is electrically connected with the main scan line;
    a driving voltage line extending in the first direction and disposed between the data line and the main scan line; and
    a shield layer disposed on a layer that is different from a layer on which the driving voltage line is disposed, the shield layer being electrically connected with the driving voltage line, wherein the shield layer overlaps each of the data line and the main scan line.

13. The display apparatus of claim 12, wherein the data line, the main scan line, and the driving voltage line are disposed on a same layer.

14. The display apparatus of claim 13, wherein the shield layer is disposed on a layer on which the sub scan line is disposed.

15. The display apparatus of claim 13, further comprising a storage capacitor comprising a first storage capacitor plate and a second storage capacitor plate, the second storage capacitor plate overlapping the first storage capacitor plate and being disposed on the first storage capacitor plate,
    wherein the shield layer is a portion of the second storage capacitor plate.

16. The display apparatus of claim 15, wherein the second storage capacitor plate is disposed under the data line, the main scan line, and the driving voltage line.

17. The display apparatus of claim 12, wherein two sub-pixels are disposed adjacent to each other symmetrically opposed between an axis parallel to the first direction.

* * * * *